United States Patent
Bergbauer et al.

(10) Patent No.: US 10,950,752 B2
(45) Date of Patent: Mar. 16, 2021

(54) METHOD OF PRODUCING A RADIATION-EMITTING SEMICONDUCTOR CHIP AND RADIATION-EMITTING SEMICONDUCTOR CHIP

(71) Applicant: OSRAM Opto Semiconductors GmbH, Regensburg (DE)

(72) Inventors: Werner Bergbauer, Windberg (DE); Thomas Lehnhardt, Regensburg (DE); Jürgen Off, Regensburg (DE); Lise Lahourcade, Regensburg (DE); Philipp Drechsel, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 331 days.

(21) Appl. No.: 16/067,955

(22) PCT Filed: Feb. 22, 2017

(86) PCT No.: PCT/EP2017/054016
§ 371 (c)(1),
(2) Date: Jul. 3, 2018

(87) PCT Pub. No.: WO2017/144512
PCT Pub. Date: Aug. 31, 2017

(65) Prior Publication Data
US 2020/0243716 A1   Jul. 30, 2020

(30) Foreign Application Priority Data
Feb. 25, 2016 (DE) .................... 10 2016 103 346.4

(51) Int. Cl.
*H01L 33/12* (2010.01)
*H01L 33/00* (2010.01)
*H01L 33/24* (2010.01)

(52) U.S. Cl.
CPC ............ *H01L 33/12* (2013.01); *H01L 33/007* (2013.01); *H01L 33/0075* (2013.01); *H01L 33/24* (2013.01)

(58) Field of Classification Search
CPC ... H01L 33/007; H01L 33/12; H01L 33/0075; H01L 33/24; H01L 33/0093; H01L 33/0095
See application file for complete search history.

(56) References Cited

U.S. PATENT DOCUMENTS

| 6,329,667 B1 | 12/2001 | Ota et al. |
| 8,247,314 B2 | 8/2012  | Arena |

(Continued)

FOREIGN PATENT DOCUMENTS

| CN | 105355741 A | 2/1916 |
| CN | 101836295 A | 9/2010 |

(Continued)

OTHER PUBLICATIONS

The Second Office Action dated Jul. 23, 2020, of counterpart Chinese Application No. 201780005734.0, along with an English translation.

(Continued)

*Primary Examiner* — Savitri Mulpuri
(74) *Attorney, Agent, or Firm* — DLA Piper LLP (US)

(57) ABSTRACT

A method of producing a radiation-emitting semiconductor chip includes providing a growth substrate, epitaxially growing a buffer layer on the growth substrate such that a plurality of V-pits is generated in the buffer layer, epitaxially growing a radiation-generating active semiconductor layer sequence on the buffer layer, wherein the structure of the V-pits continues into the active semiconductor layer sequence, epitaxially growing a further layer sequence on the active semiconductor layer sequence, wherein the struc- (Continued)

ture of the V-pits continues into the further layer sequence, selectively removing the further layer sequence from facets of the V-pits, wherein the further layer sequence remains on a main surface of the active semiconductor layer sequence, and epitaxially growing a p-doped semiconductor layer that completely or partially fills the V-pits.

8 Claims, 5 Drawing Sheets

(56) References Cited

U.S. PATENT DOCUMENTS

| | | | |
|---|---|---|---|
| 9,466,759 B2* | 10/2016 | Hertkorn | H01L 21/02458 |
| 2006/0246612 A1 | 11/2006 | Emerson et al. | |
| 2008/0006831 A1* | 1/2008 | Ng | H01L 33/20 |
| | | | 257/79 |
| 2010/0244042 A1 | 9/2010 | Saito et al. | |
| 2011/0084308 A1 | 4/2011 | Loh et al. | |
| 2011/0121357 A1 | 5/2011 | Lester et al. | |
| 2012/0033444 A1 | 2/2012 | Moon et al. | |
| 2012/0068196 A1 | 3/2012 | Smeeton et al. | |
| 2012/0080660 A1 | 4/2012 | Jung et al. | |
| 2012/0168753 A1* | 7/2012 | Sanga | H01L 33/02 |
| | | | 257/52 |
| 2012/0319126 A1 | 12/2012 | Butendeich et al. | |
| 2013/0037779 A1 | 2/2013 | Takeoka et al. | |
| 2013/0082273 A1* | 4/2013 | Ting | H01L 33/325 |
| | | | 257/76 |
| 2014/0131734 A1* | 5/2014 | Ting | H01L 21/02584 |
| | | | 257/76 |
| 2014/0209921 A1 | 7/2014 | Kusunoki et al. | |
| 2014/0225059 A1 | 8/2014 | Yang et al. | |
| 2014/0332756 A1* | 11/2014 | Kashihara | H01L 33/24 |
| | | | 257/22 |
| 2015/0115223 A1* | 4/2015 | Kwak | H01L 21/02458 |
| | | | 257/22 |
| 2015/0155436 A1 | 6/2015 | Jung et al. | |
| 2015/0249181 A1 | 9/2015 | Leirer et al. | |
| 2016/0056326 A1* | 2/2016 | Loffler | H01L 33/24 |
| | | | 257/13 |
| 2016/0141455 A1* | 5/2016 | Lim | H01L 33/0075 |
| | | | 257/13 |
| 2016/0218096 A1* | 7/2016 | Lee | H01L 27/0255 |
| 2018/0122988 A1* | 5/2018 | Zhang | H01L 33/007 |
| 2018/0261724 A1* | 9/2018 | Park | H01L 33/0075 |
| 2020/0119228 A1* | 4/2020 | Lehnhardt | H01L 33/18 |

FOREIGN PATENT DOCUMENTS

| | | |
|---|---|---|
| CN | 102301447 A | 12/2011 |
| CN | 102403427 A | 4/2012 |
| CN | 102983243 A | 3/2013 |
| CN | 104685644 A | 6/2015 |
| DE | 10 2013 103 602 A1 | 10/2014 |
| EP | 1 267 422 A2 | 12/2002 |
| EP | 1 401 027 A1 | 3/2004 |
| EP | 2 843 714 A1 | 3/2015 |
| JP | H11-343351 A | 9/1999 |
| JP | 2010-232597 A | 10/2010 |
| JP | 2013-187484 A | 9/2013 |
| WO | 2011/080219 A1 | 7/2011 |

OTHER PUBLICATIONS

Bell, A. et al., "Spatial variation of luminescence from AlGaN grown by facet controlled epitaxial lateral overgrowth", *Applied Physics Letters*, 2004, vol. 85, No. 16, pp. 3417-3419.

Quan, Z. et al., "Roles of V-shaped pits on the improvement of quantum efficiency in InGaN/GaN multiple quantum well light-emitting diodes", *Journal of Applied Physics*, 2014, vol. 116, pp. 183107-1-183107-5.

Decision of Rejection dated Jan. 21, 2020, of counterpart Japanese Application No. 2018-531621, along with an English translation.

Decision on Examination dated Jul. 5, 2019, of counterpart Taiwanese Application No. 106106418, along with an Explanation in English.

Notice of Reasons for Rejection dated Jun. 25, 2019, of counterpart Japanese Application No. 2018-531621, along with an English translation.

* cited by examiner

METHOD OF PRODUCING A RADIATION-EMITTING SEMICONDUCTOR CHIP AND RADIATION-EMITTING SEMICONDUCTOR CHIP

TECHNICAL FIELD

This disclosure relates to a method of producing a radiation-emitting semiconductor chip and a radiation-emitting semiconductor chip.

BACKGROUND

A method of producing a radiation-emitting semiconductor chip is specified, for example, in WO 2011/080219. There is nonetheless a need to provide a radiation-emitting semiconductor chip having an increased efficiency and a method of producing such a semiconductor chip.

SUMMARY

We provide a method of producing a radiation-emitting semiconductor chip including providing a growth substrate, epitaxially growing a buffer layer on the growth substrate such that a plurality of V-pits is generated in the buffer layer, epitaxially growing a radiation-generating active semiconductor layer sequence on the buffer layer, wherein the structure of the V-pits continues into the active semiconductor layer sequence, epitaxially growing a further layer sequence on the active semiconductor layer sequence, wherein the structure of the V-pits continues into the further layer sequence, selectively removing the further layer sequence from facets of the V-pits, wherein the further layer sequence remains on a main surface of the active semiconductor layer sequence, and epitaxially growing a p-doped semiconductor layer that completely or partially fills the V-pits.

We also provide a radiation-emitting semiconductor chip including an epitaxial growth substrate, an active radiation-generating layer sequence, a further layer sequence on the radiation-generating layer sequence, and a p-doped semiconductor layer, wherein a plurality of V-pits extend from the further layer sequence through the further layer sequence and the radiation-generating semiconductor layer sequence, and the plurality of V-pits taper proceeding from the further layer sequence through the radiation-generating layer sequence, and material of the p-doped semiconductor layer completely or partially fills the V-pits and the material of the p-doped semiconductor layer at the facets of the V-pits is in direct contact with the radiation-generating semiconductor layer sequence.

We further provide a radiation-emitting semiconductor chip including an epitaxial growth substrate, an active radiation-generating layer sequence, a further electron-blocking layer sequence on the radiation-generating layer sequence, and a p-doped semiconductor layer, wherein a plurality of V-pits extend from the further layer sequence through the further electron-blocking layer sequence and the radiation-generating semiconductor layer sequence, and the plurality of V-pits taper proceeding from the further electron-blocking layer sequence through the radiation-generating layer sequence, and material of the p-doped semiconductor layer completely or partially fills the V-pits and the material of the p-doped semiconductor layer at the facets of the V-pits is in direct contact with the radiation-generating semiconductor layer sequence.

Figure 1:
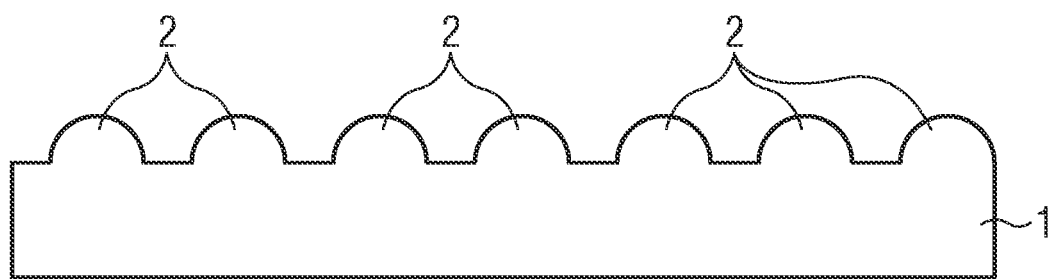
FIGS. 1 to 6 show an example of a method explained in more detail in a schematic sectional view.

LIST OF REFERENCE NUMERALS 1 growth substrate
2 structural elements
3 buffer layer
4 V-pits
5 radiation-generating semiconductor layer sequence
6 quantum film
7 barrier layer
8 facet of the V-pits
9 further layer sequence
10 AlGaN layer
11 InGaN layer
12 main surface of the active layer sequence
13 regions of the further layer sequence
14 regions of the facets
15 p-doped semiconductor layer
16 main surface of the substrate
+ holes

DETAILED DESCRIPTION

In our method of producing a radiation-emitting semiconductor chip, initially, a growth substrate is provided. The growth substrate can have sapphire, SiC, GaN, AlN or silicon, for example, or consist of one of these materials.

A buffer layer may be epitaxially grown on the growth substrate. In this case, a plurality of V-pits are produced in the buffer layer.

For example, the buffer layer has a thickness of 1 micrometer to 15 micrometers.

Recesses in an epitaxially grown layer are referred to as V-pits or V-defects, which are formed in the form of a pyramid or a truncated pyramid. The pyramid or the truncated pyramid is preferably formed as a straight pyramid or a straight truncated pyramid. Such defects have the shape of a V in a sectional view. This is attributed to the designation of the defects. Particularly preferably, the V-pits have a hexagonal base surface and a lateral surface composed of six facets. Furthermore, it is also possible for the V-pits to have a lateral surface with, for example, 12 facets. The number of facets of a V-pit can be a multiple of six.

The facets of a V-pit may each be formed not only from a continuous surface, but from at least two surfaces having an angle with respect to one another such that the respective facet has at least one kink. Such V-pits have a sectional view, in which at least one leg of the Vs has at least two partial sections with different slopes.

For example, the base surface of the V-pits, preferably at maximum open V-pits, have a diameter of 20 nanometers to 1000 nanometers.

The height of the V-pits is preferably 15 nanometers to 800 nanometers, particularly preferably 100 nanometers to 400 nanometers.

A radiation-generating active semiconductor layer sequence may be epitaxially grown on the buffer layer. In this case, the structure of the V-pits continues into the active semiconductor layer sequence. In this case, the facets of the V-pits are typically covered with the material of the further radiation-generating active semiconductor layer sequence. However, the radiation-generating active semiconductor layer sequence preferably has a substantially smaller thickness on the facets of the V-pits than on a main area of the buffer layer. For example, the active semiconductor layer sequence has a thickness on the facets of the V-pits, which is perpendicular to a surface of the facets, and less than 50% of its thickness on the main surface of the buffer layer. Alternatively or additionally, the active semiconductor layer sequence can furthermore have a change in the composition on the facets of the V-pits than on the main surface of the buffer layer.

A further layer sequence may be epitaxially grown on the active semiconductor layer sequence in which the structure of the V-pits likewise continues. In this case, the facets of the V-pits are typically covered with the material of the further layer sequence. However, the further layer sequence on the facets of the V-pits also preferably has a substantially smaller thickness and/or a different composition than on a main surface of the active semiconductor layer sequence.

The further layer sequence is particularly preferably formed as an electron-blocking layer sequence. In other words, the further layer sequence should form a barrier for electrons and thus prevent, in the finished semiconductor chip, a loss of electrons into the further layer sequence from the radiation-generating layer sequence.

Particularly preferably, in a next step, the further layer sequence is selectively removed from the facets of the V-pits, wherein the further layer sequence remains on the main surface of the active semiconductor layer sequence. Particularly preferably, the further layer sequence completely covers the main area of the active semiconductor layer sequence, even after the removal. However, it is possible, that a substantially uniform material removal takes place over the main surface of the further layer sequence during the selective removal of the further layer sequence from the facets. Particularly preferably, the material of the further layer sequence is completely removed from the facets of the V-pits such that the semiconductor material of the radiation-generating active semiconductor layer sequence is exposed.

In a next step, a p-doped semiconductor layer is epitaxially grown, which can completely or partially fill the V-pits. In this case, the material of the p-doped semiconductor layer is particularly preferably in direct contact with the material of the active semiconductor layer sequence within the V-pits.

In this case, the p-doped semiconductor layer is particularly preferably epitaxially grown such that the p-doped semiconductor layer completely covers the main surface of the further layer sequence and the p-doped semiconductor layer forms a certain thickness, proceeding from the further layer sequence. For example, the p-doped layer has a thickness of 1 nanometer to 500 nanometers, proceeding from the main surface of the further layer sequence.

Particularly preferably, the buffer layer, the radiation-generating active semiconductor layer sequence, the further layer sequence and the p-doped semiconductor layer comprise a nitride compound semiconductor material or consist of a nitride compound semiconductor material. Nitride compound semiconductor materials are compound semiconductor materials containing nitrogen such as the materials from the system $In_xAl_yGa_{1-x-y}N$ where $0 \leq x \leq 1$, $0 \leq y \leq 1$ and $x+y \leq 1$. For example, the following materials are nitride compound semiconductor materials: GaN, InGaN, AlGaN.

The active semiconductor layer sequence may have a plurality of quantum films separated from one another by barrier layers. The quantum films and the barrier layers are preferably arranged alternately. Particularly preferably, the quantum films comprise InGaN or consist of InGaN, while the barrier layers comprise GaN or consist of GaN. Alternatively, the barrier layers can also have AlGaN or consist of AlGaN.

The quantum films preferably have radiation-generating quantum structures such as, for example, quantum dots, quantum wires or quantum wells.

The further layer sequence may be formed from alternately arranged AlGaN layers and InGaN layers or from alternately arranged AlGaN layers and GaN layers or from alternately arranged InGaN layers and GaN layers.

Particularly preferably, the thickness of the further layer sequence on the facets of the V-pits is formed thinner than on a main surface of the active semiconductor layer sequence. Particularly preferably, the further layer sequence has a thickness of 5 nanometers to 200 nanometers on the facets of the V-pits. On the main surface of the active semiconductor layer sequence, the further layer sequence has a thickness of 10 nanometers to 400 nanometers after the epitaxial growth and before the selective removal.

Typically, it is possible to form the further layer sequence thinner on the facets of the V-pits since they have a different morphology and surface reconstruction than the main area of the active semiconductor layer sequence. For example, the epitaxial layers are grown on the main surface of a sapphire substrate, which has a one (0001) orientation. Such a main surface of a sapphire substrate is also referred to as a c-surface. Correspondingly, the main surfaces of the subsequently epitaxially grown layers such as, for example, the main surface of the active semiconductor layer sequence, have a (0001)-oriented main surface. The different morphology and surface reconstruction of the facets typically results that the material of the further layer sequence is formed thinner and/or with a different composition during the epitaxy on the facets of the V-pits than on a main surface of the active semiconductor layer sequence.

The (0001) main surfaces are typically polar in a nitride compound semiconductor material on account of the crystal structure of such semiconductor materials. The facets of V-pits in a nitride compound semiconductor material grown in this way typically have a {1-101}-orientation and are thus semi-polar.

Each V-pit may be delimited by six facets formed by a non-polar or semi-polar surface, preferably by a semi-polar {10-11} surface.

Due to the difference of the morphology and the surface reconstruction between the main surface and the facets of the V-pits, it is possible, that the aluminum content and/or the indium content of the further layer sequence, which is applied to the facets of the V-pits, is preferably reduced relative to the aluminum content of the further layer sequence, which is applied to the main surface of the active layer sequence.

For example, the value of the indium content on the facets of the V-pits has a value of 0.1% to 60%, preferably 0.5% to 10%, while the indium content of the further layer sequence on the main surface of the active semiconductor layer sequence preferably has a value of 1% to 30%.

For example, the value of the aluminum content on the facets of the V-pits has a value of 1% to 100%, preferably 5% to 25%, while the aluminum content of the further layer sequence on the main surface of the active semiconductor layer sequence preferably has a value of 1% to 100%.

Particularly preferably, the further layer sequence is selectively removed in situ from the facets of the V-pits by etching in the epitaxy reactor. In other words, the growth substrate with the grown buffer layer and the grown active semiconductor layer sequence and the grown further layer sequence is removed by etching in the epitaxy reactor. Particularly preferably, the workpiece remains between the growth processes and the etching process in the epitaxy reactor. This simplifies the production of the semiconductor chip.

To achieve a material removal from the further layer sequence in the epitaxy reactor during the etching process, the process parameters in the epitaxy reactor are correspondingly changed in relation to the growth process. For example, the hydrogen content during etching is increased relative to the hydrogen content during epitaxial growth within the epitaxy reactor. For example, the hydrogen content during the epitaxial growth within the epitaxy reactor has a value of 0 to four times the sum of the hydrides, which do not correspond to hydrogen, while the hydrogen content within the epitaxy reactor during the etching is, for example, at least the tenth part of the sum of the hydrides, which do not correspond to hydrogen.

For the epitaxial deposition of nitride compound semiconductor materials, gaseous precursor materials are typically present in the epitaxy reactor, wherein the precursor materials comprise nitrogen and a further precursor material comprises an element from the group III of the periodic table such as, for example, gallium, aluminum or indium. The ratio of nitrogen to an element of the group III may be reduced relative to the growth process during the etching process. For example, the ratio of nitrogen available for growth to an element of the group III available for growth, has a value greater than 0.2 during the epitaxy process on the surface, preferably greater than 1, while it has a value of less than 1, preferably less than 0.1, during the etching.

An adaptation of temperature and pressure can also change the conditions in the epitaxy reactor such that instead of a growth the further layer sequence is removed.

Furthermore, it is possible that regions of the further layer sequence that directly adjoin the edges of the openings of the V-pits in the further layer sequence, are removed obliquely during the selective removal of the further layer sequence from the semiconductor facets of the V-pits such that the facets of the V-pits in the region formed by the further layer sequence have a greater inclination with respect to a normal of the main surface of the active semiconductor layer sequence than the rest of the facet.

A radiation-emitting semiconductor chip may comprise an epitaxial growth substrate, an active radiation-generating layer sequence and a further layer sequence.

Furthermore, the semiconductor chip preferably comprises a p-doped semiconductor layer, wherein a plurality of V-pits extend from the further layer sequence through the further layer sequence and the radiation-generating semiconductor layer sequence. In this case, the V-pits taper proceeding from the further layer sequence through the radiation-generating layer sequence.

In this case, the material of the p-doped semiconductor layer fills the V-pits particularly preferably completely or also partially and is in direct contact with the radiation-generating semiconductor layer sequence at the facets of the V-pits.

Particularly preferably, the main surface of the growth substrate on which the buffer layer is epitaxially grown is structured. Structuring of the growth substrate can comprise, for example, structural elements formed as dome-shaped domes. The dome-shaped domes particularly preferably have a base with a diameter of 0.4 micrometers to 3.9 micrometers. The height of the domes is particularly preferably 0.5 micrometer to 3 micrometers.

Particularly preferably, the buffer layer is formed n-doped at least in the region adjoining the active semiconductor layer sequence.

One aspect of the method is to completely remove the further layer sequence, which is typically arranged to block electrons between the p-doped layer and the radiation-generating semiconductor layer sequence, but also to prevent the injection of holes from the facets of the V-pits and thus enable a better injection of holes from the p-doped semiconductor layer into the radiation-generating zone. Thus, the quantum films of the active semiconductor layer sequence are supplied with holes more uniformly perpendicular to their main extension direction. In particular, quantum films having a greater distance from the p-doped layer are supplied with holes in a better way. In this way, the current densities that are necessary are advantageously reduced to achieve a specific radiation yield of the semiconductor chip. In particular, the current density in the individual quantum films is reduced, with the result that the probability of non-radiative loss processes of the charge carriers in the active radiation-generating semiconductor layer sequence is reduced at nominal current. The nominal current has, for example, current densities of at least 5 a/cm$^2$. This leads to an increased efficiency of the semiconductor chips.

Furthermore, removal of the further layer sequence from the facets of the V-pits leads to a lower serial resistance for injection of holes into the quantum films and consequently to a reduction in the forward voltage.

Features and examples, which are described herein only in connection with the method can also be formed in the semiconductor chip, if technically feasible, and vice versa.

Further advantages and developments result from the examples described below in conjunction with the figures.

Identical, similar or equivalent elements are provided in the figures with the same reference numerals. The figures and the proportions of the elements shown in the figures among one another are not to be considered to scale. On the contrary, individual elements, in particular layer thicknesses, can be exaggerated for better representability and/or better understanding.

In the method according to the example of FIGS. 1 to 6, a growth substrate 1 is provided in a first step such as sapphire (FIG. 1). The first main surface of the sapphire substrate 1 is structured, for example, with dome-like structure elements as already described in the general part of the description.

Figure 2:
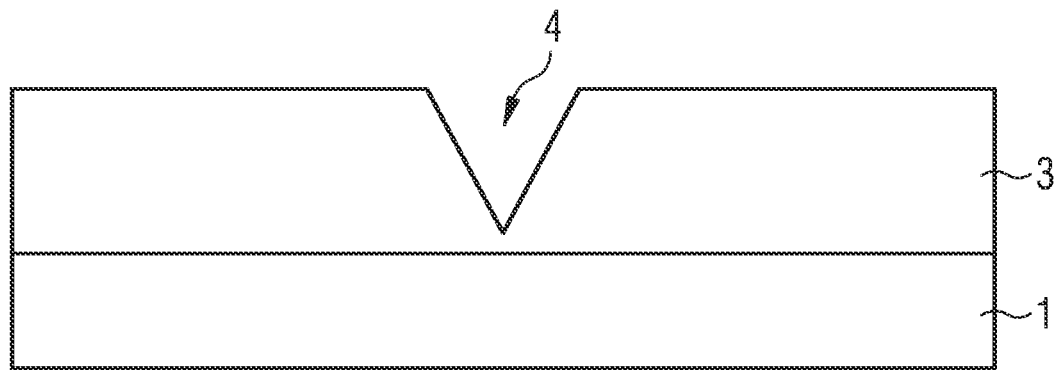

In a next step schematically represented in FIG. 2, a buffer layer 3 is deposited epitaxially on the growth substrate 1. In this case, the buffer layer 3 has GaN or is formed from GaN. In the buffer layer 3, a plurality of V-pits 4 are formed during the epitaxial growth. For the sake of clarity, only one V-pit 4 is shown by way of example in FIG. 2.

The buffer layer 3 is formed n-doped at least in the region facing away from the growth substrate 1. The V-pits 4 can extend through the buffer layer 3 to the growth substrate 1 or, as illustrated schematically in FIG. 2, only penetrate a partial region of the buffer layer 3.

In a next step, a radiation-generating active semiconductor layer sequence 5 is deposited epitaxially on the buffer layer 3 (not illustrated). The radiation-generating semiconductor layer sequence 5 is formed from alternately arranged barrier layers 6 and quantum films 7. In this case, the barrier layers 6 are formed from GaN, AlGaN or InGaN or AlInGaN or have one of these materials, while the quantum films 7 comprise InGaN or consist of InGaN.

During the epitaxial growth of the active radiation-generating semiconductor layer sequence 5, the V-pits 4 continue into the radiation-generating semiconductor layer sequence 5. In this case, the facets 8 of the V-pits are likewise completely covered with the quantum films 6 and the barrier layers 7 of the active semiconductor layer sequence 5.

Figure 3:
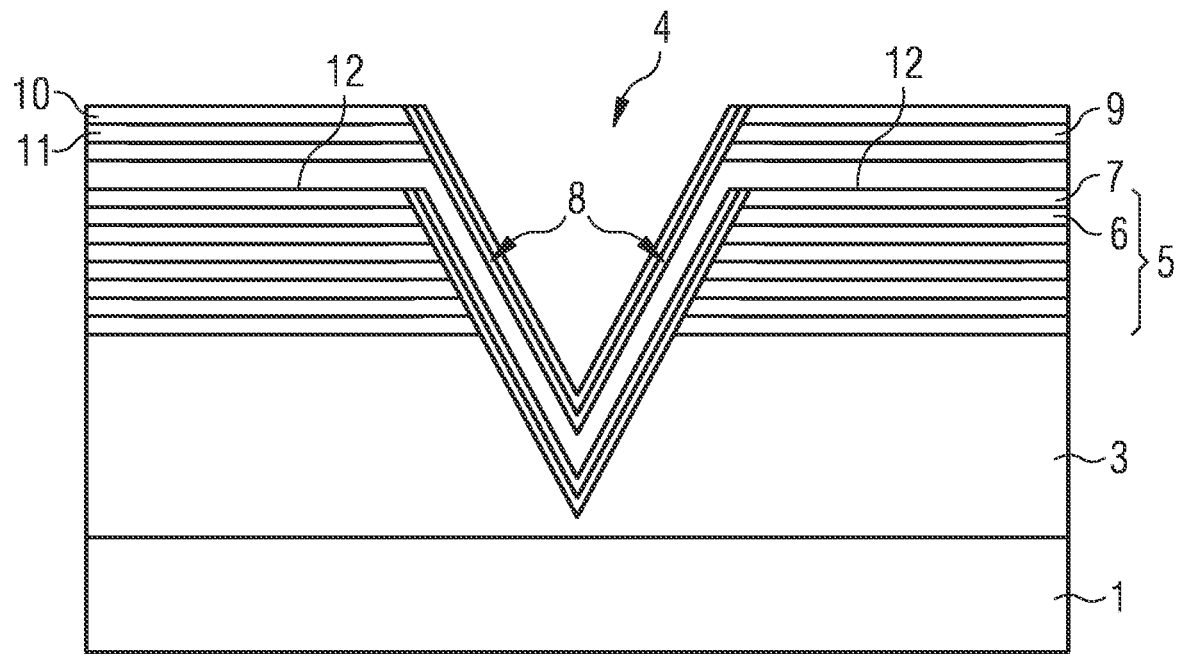

In a subsequent step, which is schematically illustrated in FIG. 3, a further layer sequence 9 is deposited epitaxially on the radiation-generating semiconductor layer sequence 5. The further layer sequence 5 is formed from alternately arranged AlGaN layers 10 and InGaN layers 11. Instead of the AlGaN or InGaN layers 11, GaN layers can also be used. The further layer sequence 9 is in this case an electron-blocking layer sequence.

The further layer sequence 9 is also deposited on the facets 8 of the V-pits 4 during the epitaxial growth. However, the further layer sequence 9 on the facets 8 of the V-pit 4 can have a lower aluminum content and a low thickness than on a main surface 12 of the active radiation-generating semiconductor layer sequence 5.

Figure 4:
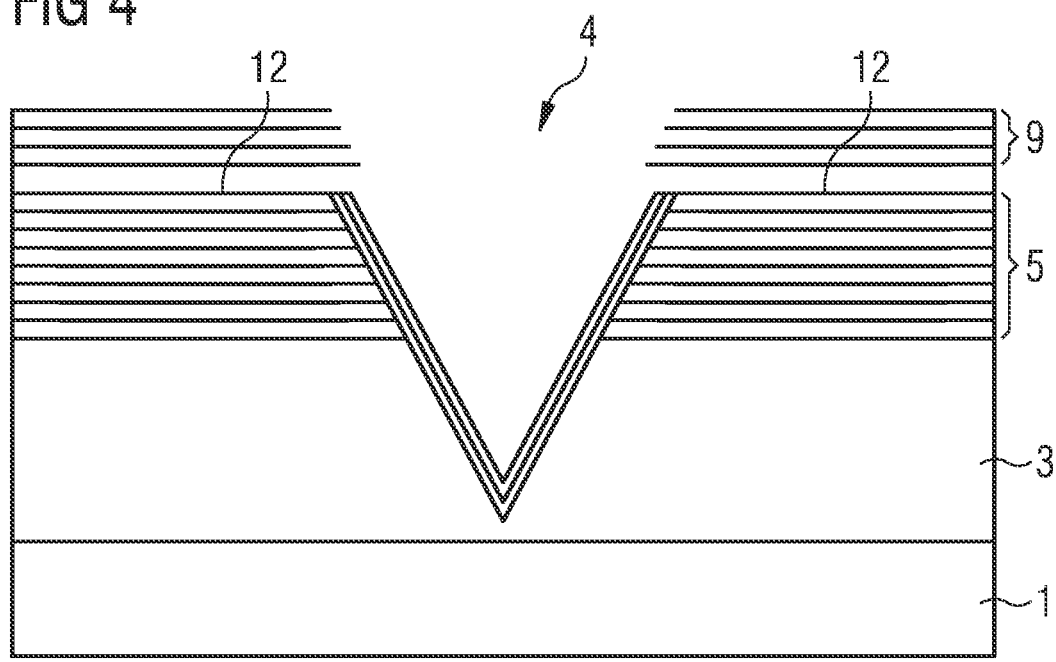

In a next step schematically illustrated in FIG. 4, the further layer sequence 9 is removed again from the facets 8 of the V-pits 4, while the further layer sequence 9 remains on the main surface 12 of the radiation-generating semiconductor layer sequence 5. In this case, it is possible that the thickness of the further layer sequence 9 is reduced on the main area 12 of the radiation-generating semiconductor layer sequence 5.

The further layer sequence 9 can be removed from the facets 8 of the V-pits 4, for example, in situ within the epitaxy reactor by changing the process parameters in the reactor.

Figure 5:
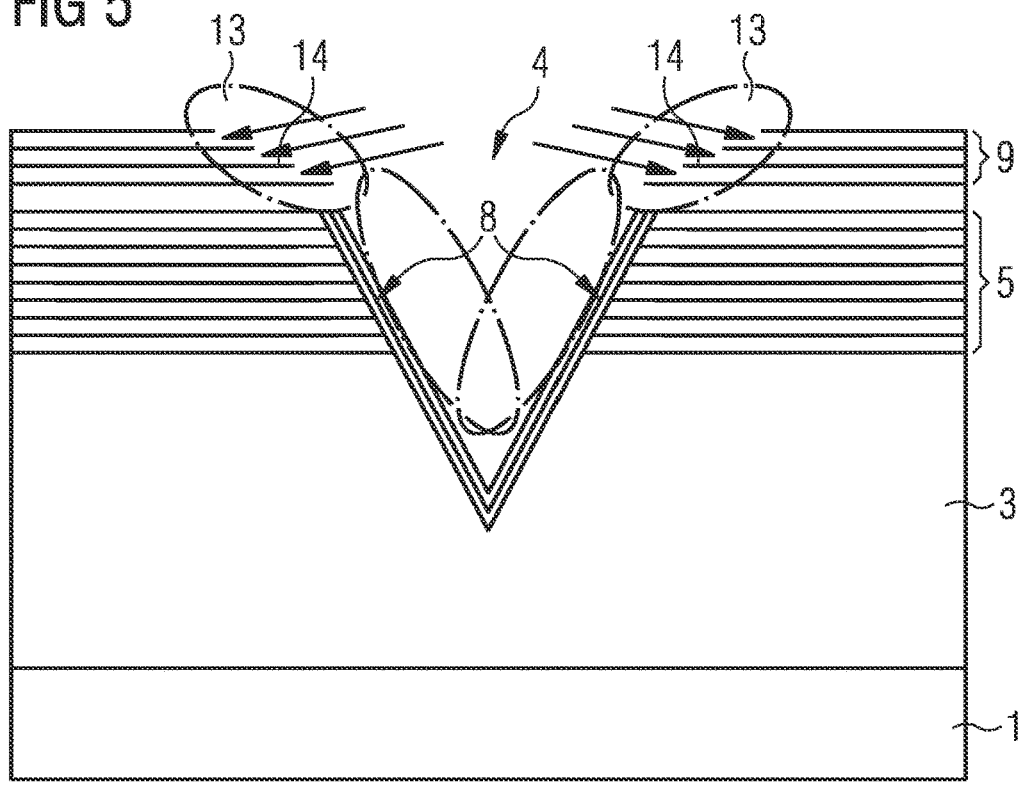

Furthermore, it is possible, as shown schematically in FIG. 5, that the regions 13 of the further layer sequence 9 directly adjoining the edges of the opening of the V-pits 4 in the further layer sequence 9 are removed more strongly during the selective removal of the further layer sequence 9 from the facets 8 of the V-pits 4 so that the facets 8 of the V-pits 4 in the region 14 formed by the further layer sequence 9 have a greater inclination with respect to a normal of the main surface 12 of the active semiconductor layer sequence 5 than the rest of the facet 8.

Figure 6:
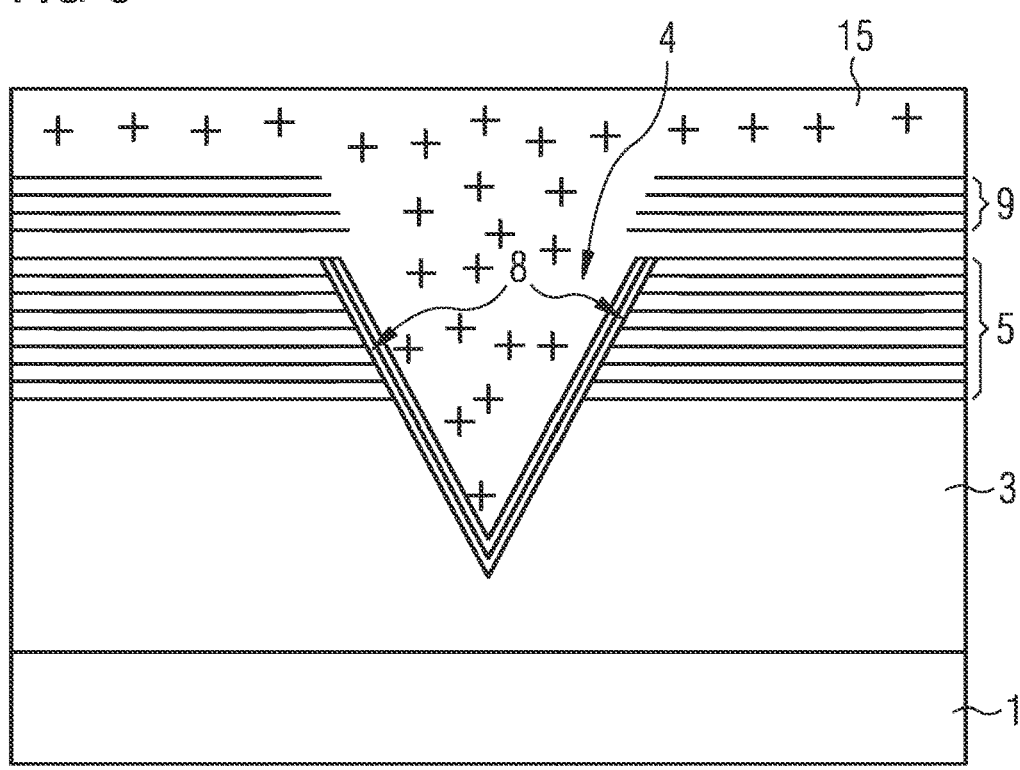

In a next step schematically illustrated in FIG. 6, a p-doped semiconductor layer 15 is epitaxially grown on the further semiconductor layer sequence 9. The p-doped semiconductor layer 15 completely fills the V-pits 4. Since the material of the further layer sequence 9 has been removed from the facets 8 of the V-pits 4, the material of the p-doped semiconductor layer 15 is in direct contact with the radiation-generating semiconductor layer sequence 5. Furthermore, the p-doped semiconductor layer 15 has a certain thickness above the radiation-generating layer sequence 5.

Figure 7:
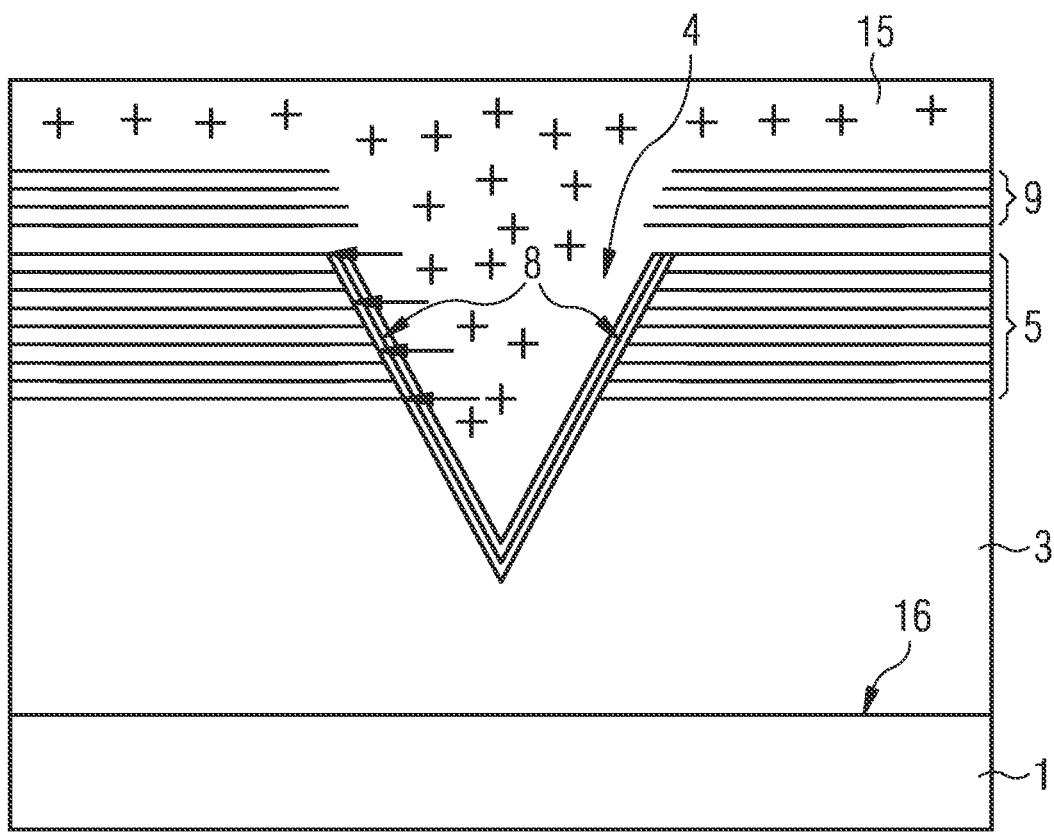
FIG. 7 shows a schematic sectional illustration of a semiconductor chip according to an example.

The semiconductor chip according to the example of FIG. 7 has a growth substrate 1 formed from sapphire, for example. A buffer layer 3, which has GaN, is applied to a main surface 16 of the growth substrate 1, which can be structured as already described above. The buffer layer 3 is formed n-doped at least in the region facing away from the main surface 16 of the growth substrate 1.

A radiation-generating active semiconductor layer sequence 5 having alternately arranged quantum films 6 and barrier layers 7 is formed on the buffer layer 3. The barrier layers 7 are formed, for example, from GaN, while the quantum films 6 are formed from InGaN.

A further layer sequence 9 formed from alternating AlGaN layers 10 and InGaN or GaN layers 11 is arranged on the active radiation-generating semiconductor layer sequence 5.

The semiconductor chip according to the example of FIG. 7 comprises a plurality of V-pits 4 and a p-doped semiconductor layer 15, the material of which completely fills the V-pits 4. In this case, the V-pits 4 completely penetrate the further layer sequence 9 and the radiation-generating layer sequence 5 completely and the buffer layer 3 partially, wherein the cross section of the V-pits 4 tapers continuously proceeding from the p-doped layer 15 to the buffer layer 3.

The material of the p-doped semiconductor layer 15 is in direct contact with the radiation-generating semiconductor layer sequence 5 at the facets 8 of the V-pits 4. The arrows in FIG. 7 are intended to symbolize schematically the improved supply of the quantum films 6 in the active semiconductor layer sequence 5 with holes + from the p-doped layer 15.

Figure 8:
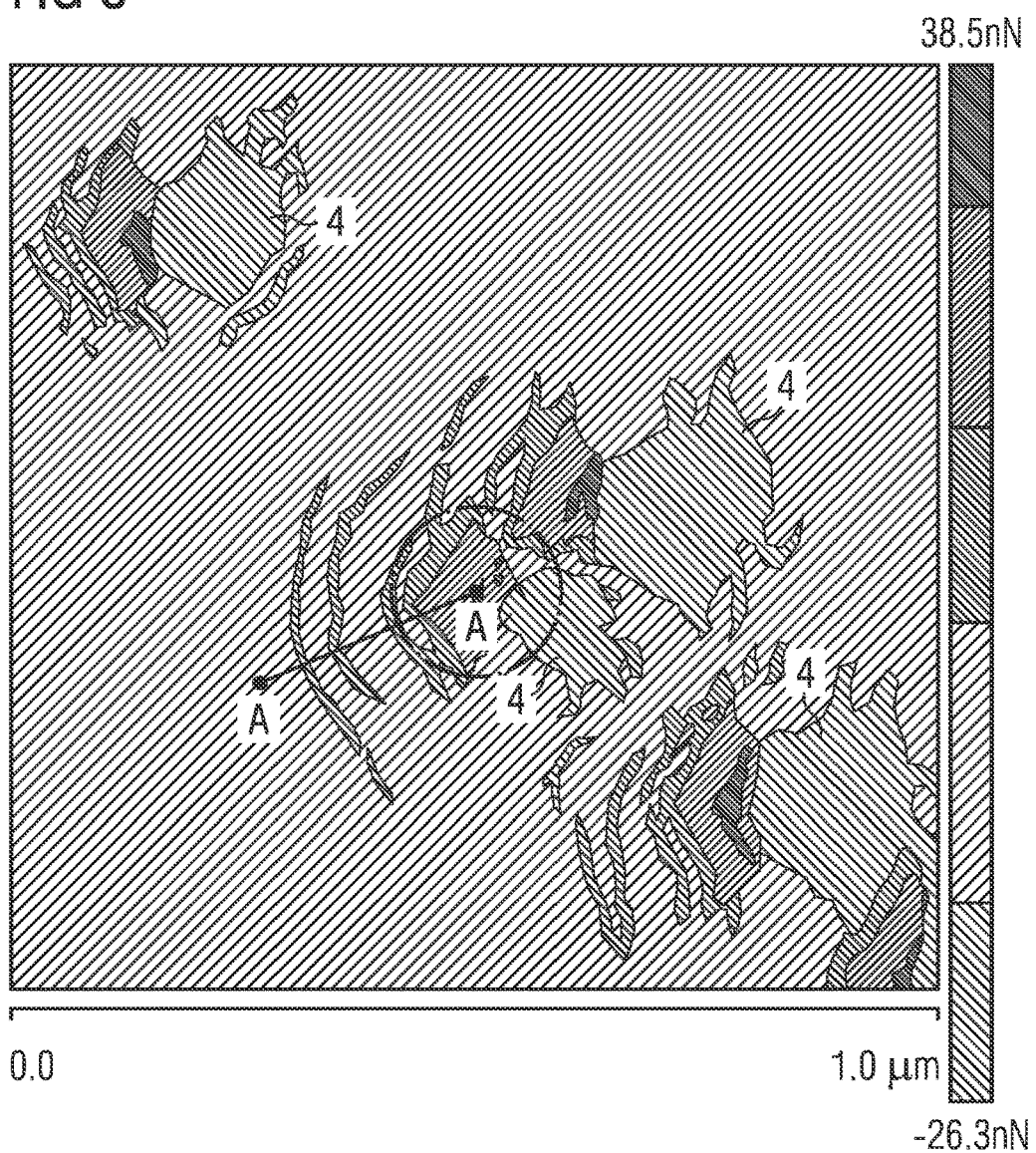
FIG. 8 shows by way of example a schematic illustration of a scanning force microscopy image of an etched surface of a further layer sequence.
Figure 9:
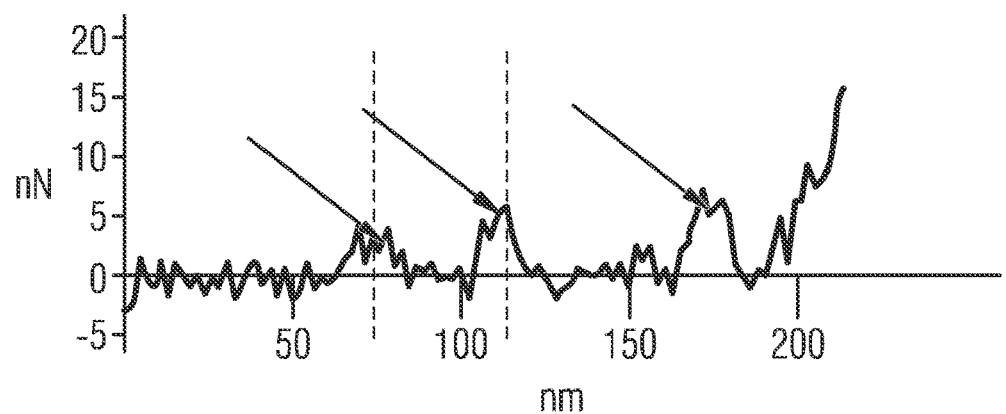
FIG. 9 shows by way of example a height profile of the image from FIG. 8 along the line AA'.

FIG. 8 shows, by way of example, a schematic illustration of a scanning force microscopy image of the surface of a further layer sequence 9 in the region of a plurality of V-pits 4, while FIG. 9 shows, by way of example, a height profile along the line AA' of FIG. 8. In this case, the arrows in FIG. 8 denote the same points on the surface of the scanning force microscopy image as the arrows in the height profile of FIG. 9. The bight circled area in the image of FIG. 8 shows laterally removed regions of the further layer sequence 9 around the V-pit 4, as has already been described with reference to FIG. 5.

This application claims priority of DE 102016103346.4, the subject matter of which is incorporated herein by reference.

Our methods and chips are not restricted by the description given with reference to the examples. Rather, this disclosure encompasses any novel feature and any combination of features, including in particular any combination of features in the appended claims, even if the feature or combination is not itself explicitly specified in the claims or the examples.

The invention claimed is:

1. A method of producing a radiation-emitting semiconductor chip comprising:
   providing a growth substrate,
   epitaxially growing a buffer layer on the growth substrate such that a plurality of V-pits is generated in the buffer layer,
   epitaxially growing a radiation-generating active semiconductor layer sequence on the buffer layer, wherein the structure of the V-pits continues into the active semiconductor layer sequence,
   epitaxially growing a further layer sequence on the active semiconductor layer sequence, wherein the structure of the V-pits continues into the further layer sequence,
   selectively removing the further layer sequence from facets of the V-pits, wherein the further layer sequence remains on a main surface of the active semiconductor layer sequence, and
   epitaxially growing a p-doped semiconductor layer that completely or partially fills the V-pits.

2. The method according to claim 1, wherein the active semiconductor layer sequence has a plurality of quantum films separated from one another by barrier layers, and the quantum films have InGaN and the barrier layers have GaN or AlGaN.

3. The method according to claim 1, wherein the further layer sequence is completely removed from the facets of the V-pits such that the p-doped semiconductor layer at the facets is in direct contact with the active semiconductor layer sequence.

4. The method according to claim 1, wherein the further layer sequence is formed from alternately arranged AlGaN layers and InGaN layers or from alternately arranged AlGaN layers and GaN layers or from alternately arranged InGaN layers and GaN layers.

5. The method according to claim 4, wherein the thickness of the further layer sequence on the facets of the V-pits is formed thinner than on a main surface of the active semiconductor layer sequence.

6. The method according to claim 4, wherein the aluminum content and/or indium content of the further layer sequence applied to the facets of the V-pits is reduced relative to the aluminum content and/or the indium content of the further layer sequence applied to the main surface of the active semiconductor layer sequence.

7. The method according to claim 1, wherein the further layer sequence is selectively removed in situ from the facets of the V-pits by etching in the epitaxy reactor.

8. The method according to claim 7, wherein a hydrogen content during the etching process is increased relative to a hydrogen content during the epitaxial growth process within the epitaxy reactor.

\* \* \* \* \*